(12) United States Patent
Seidel et al.

(10) Patent No.: US 11,869,563 B2
(45) Date of Patent: Jan. 9, 2024

(54) MEMORY CIRCUITS EMPLOYING SOURCE-LINE AND/OR BIT-LINE-APPLIED VARIABLE PROGRAMMING ASSIST VOLTAGES

(71) Applicant: GlobalFoundries Dresden Module One Limited Liability Company & Co. KG, Dresden (DE)

(72) Inventors: Konrad Seidel, Dresden (DE); Franz Müller, Dresden (DE)

(73) Assignee: GlobalFoundries Dresden Module One Limited Liability Company & Co. KG, Dresden (DE)

( * ) Notice: Subject to any disclaimer, the term of this patent is extended or adjusted under 35 U.S.C. 154(b) by 0 days.

(21) Appl. No.: 17/547,298

(22) Filed: Dec. 10, 2021

(65) Prior Publication Data
US 2023/0186964 A1    Jun. 15, 2023

(51) Int. Cl.
*G11C 11/22* (2006.01)
*G11C 16/24* (2006.01)
*G11C 16/08* (2006.01)

(52) U.S. Cl.
CPC ...... *G11C 11/2255* (2013.01); *G11C 11/2257* (2013.01); *G11C 16/08* (2013.01); *G11C 16/24* (2013.01)

(58) Field of Classification Search
CPC ............ G11C 11/2255; G11C 11/2257; G11C 11/225; G11C 11/2273; G11C 11/2275;
(Continued)

(56) References Cited

U.S. PATENT DOCUMENTS 5,966,332 A * 10/1999 Takano .............. G11C 16/0425
                                                                         365/185.28
7,907,437 B2 * 3/2011 Lee ..................... G11C 13/0064
                                                                         365/205
(Continued)

FOREIGN PATENT DOCUMENTS

DE         102015015854 A1      6/2017

OTHER PUBLICATIONS

Hoffman et al., "Ferroelectric Negative Capacitance Domain Dynamics," Journal of Applied Physics, vol. 123, No. 18, S. 184101, 2018, pp. 1-11.

(Continued)

*Primary Examiner* — Kretelia Graham
(74) *Attorney, Agent, or Firm* — David Cain; Hoffman Warnick LLC

(57) ABSTRACT

Disclosed is a threshold voltage-programmable field effect transistor-based (e.g., a ferro-electric field effect transistor (FeFET)-based) memory circuit employing source-line and/or bit-line-applied variable programming assist voltages. For single-bit data storage in a FeFET, decremental programming assist voltages are selectively applied by a voltage driver to the source-line and/or the bit-line connected to a FeFET during repeat programming processes when previous attempts at programming have failed. For multi-bit data storage in a FeFET, different programming assist voltages are associated with different multi-bit data values and at least one specific programming assist voltage is applied by a voltage driver to the source-line and/or the bit-line connected to a selected FeFET during a programming process to achieve storage of a specific multi-bit data value. Optionally, multiple FeFETs in the same row can be currently programmed with different multi-bit data values. Optionally, (Continued)

different decremental programming assist voltages are applied if/when repeat programming processes are required.

18 Claims, 9 Drawing Sheets

(58) Field of Classification Search
CPC ..... G11C 11/2277; G11C 16/08; G11C 16/24; G11C 7/1051; G11C 7/1078; G11C 7/1096; G11C 7/12
See application file for complete search history.

(56) References Cited

U.S. PATENT DOCUMENTS

| | | | | |
|---|---|---|---|---|
| 8,335,110 | B2* | 12/2012 | Tanaka | G11C 16/3454 |
| | | | | 365/185.24 |
| 10,127,964 | B2 | 11/2018 | Sun et al. | |
| 10,127,990 | B1 | 11/2018 | Rana | |
| 2016/0027490 | A1 | 1/2016 | Muller | |
| 2016/0322368 | A1 | 11/2016 | Sun et al. | |
| 2021/0366550 | A1* | 11/2021 | Cho | G11C 16/0483 |
| 2022/0375533 | A1* | 11/2022 | Lim | G11C 11/5628 |

OTHER PUBLICATIONS

Mueller et al., "From MFM Capacitors Toward Ferroelectric Transistors: Endurance and Disturb Characteristics of HfO2-Based FeFET Devices," IEEE Transactions Electron Devices, vol. 60, No. 12, 2013, pp. 4199-4205.

Moyer, Bryon, "FeFETs Bring Promise And Challenges," Semiconductor Engineering, https://semiengineering.com/fefets-bring-promise-and-challenges/, Accessed on Oct. 12, 2021, pp. 1-28.

Muller et al., "Ferroelectric Hafnium Oxide Based Materials and Devices: Assessment of Current Status and Future Prospects," ECS Journal of Solid State Science and Technology, vol. 4, Issue 5, 2015, pp. 30-35.

Rad, Reza M., "Ferroelectric Field Effect Transistors," Based on pp. 387-403 of "Nanoelectronics and Information Technology", Rainer Waser, pp. 1-24.

Reis et al., "Design and Analysis of an Ultra-Dense, Low-Leakage and Fast FeFET-Based Random Access Memory Array," IEEE Journal on Exploratory Solid-State Computational Devices and Circuits, vol. 5, Issue 2, 2019, pp. 1-8.

Zeng et al., "Electric Field Gradient-Controlled Domain Switching for Size Effect-Resistant Multilevel Operations in HfO2-Based Ferroelectric Field-Effect Transistor," Research Article, Advanced Functional Materials, 20110077, 2021, pp. 1-9.

Zeng et al., "2-Bit/Cell Operation of Hf0.5Zr0.5O2 Based FeFET Memory Devices for NAND Applications," Journal of the Electron Devices Society, vol. 7, 2019, pp. 551-556.

* cited by examiner

| | FeFET Being Programmed | | | FeFETs Not Being Programmed | | | | |
|---|---|---|---|---|---|---|---|---|
| Scheme | WL(m) T | BL(n+1) T | SL(n+1) T | WL(m+1) | BL(n) | SL(n) | Bulk | State |
| Vdd/ | Vdd | Vpa_a=0 | Vpa_b=0 | Vdd/3 | 2Vdd/3 | 2Vdd/3 | 0 | Sym. Full PGM |
| Vdd/3 | Vdd | Vpa_a = Vpa_b | | Vdd/3 | 2Vdd/3 | 2Vdd/3 | 0 | Sym. Sub-PGM |
| Vdd/3 | Vdd | Vpa_a ≠ Vpa_b | | Vdd/3 | 2Vdd/3 | 2Vdd/3 | 0 | Asym. Sub-PGM |
| Vdd/3 | 0 | 0 | 0 | 0 | 0 | 0 | Vdd | Block ERS |
| Example: | | | | | | | | |
| Vdd/3 | 4 | 0 | 0 | 1.33 | 2.67 | 2.67 | 0 | 111 |
| Vdd/3 | 4 | 0.4 | 0.4 | 1.33 | 2.67 | 2.67 | 0 | 110 |
| Vdd/3 | 4 | 0.4 | 0 | 1.33 | 2.67 | 2.67 | 0 | 101 |
| Vdd/3 | 4 | 1 | 0.4 | 1.33 | 2.67 | 2.67 | 0 | 011 |
| Vdd/3 | 4 | 1 | 0 | 1.33 | 2.67 | 2.67 | 0 | 010 |
| Vdd/3 | 4 | 0 | 1 | 1.33 | 2.67 | 2.67 | 0 | 001 |
| Vdd/3 | 0 | 0 | 0 | 0 | 0 | 0 | Vdd | 000 |

Example: For 3-bit Data Value Storage In The Memory Structure 200A Of FIG. 2A, Voltage Sources 250a-250b Each Output The Following To Voltage Drivers 260a-260b:
Programming Inhibit Voltage = 2Vdd/3
3 Programming Assist Voltages: Vdd/4, Vdd/10, and 0V

FIG. 3

MEMORY CIRCUITS EMPLOYING SOURCE-LINE AND/OR BIT-LINE-APPLIED VARIABLE PROGRAMMING ASSIST VOLTAGES

BACKGROUND

Field of the Invention

The present invention relates to memory circuits configured for fast and precise programming operations.

Description of Related Art

Threshold voltage (VT) programmable field effect transistors (FETs) are currently being considered for use as bitcells in emerging memory technologies. Such VT-programmable FETs can include, but are not limited to, ferroelectric field effect transistors (FeFETs), charge trap field effect transistors (CTFETs) and floating gate field effect transistors (FGFETs). In VT-programmable FET-based memory circuit, an array of VT-programmable FETs, which function as bitcells, are arranged in columns and rows. During a write operation, a selected VT-programmable FET in a particular column and a particular row can be either programmed or erased as a function of a wordline voltage pulse applied to the gate of that FET through the wordline for a particular row of FETs within the array. For example, in FeFET-based memory circuit, an array of n-type FeFETs can be arranged in columns and rows. Each n-type FeFET can include a source, a drain, a channel between the source and the drain, and a gate adjacent to the channel. During a write operation, a selected FeFET can be either programmed or erased. In either case, the source and drain of the FeFET are typically connected to ground and a wordline voltage pulse on the gate controls whether the selected FeFET is programmed or erased.

SUMMARY

Disclosed herein are embodiments of a memory structure and, particularly, embodiments of a threshold voltage programmable field effect transistor (VT-programmable FET)-based memory circuit (e.g., a ferroelectric field effect transistor (FeFET)-based memory circuit) that employs variable source-line and/or bit-line-applied programming assist voltages during write operations and, particularly, during programming operations. For example, for single-bit data storage in a selected FeFET in a FeFET-based memory circuit, decremental programming assist voltages can be selectively applied by a voltage driver to the source-line and/or the bit-line connected to the selected FeFET during repeat programming processes when previous attempts at programming have failed. For multi-bit data storage in a selected FeFET in a FeFET base memory circuit, different programming assist voltages can be associated with different multi-bit data values and at least one specific programming assist voltage can be selectively applied by at least one voltage driver to the source-line and/or the bit-line connected to the selected FET during a programming process to achieve storage of a specific multi-bit data value. In this case, the different programming assist voltages can also optionally be variable (e.g., so that decremental programming assist voltages can be applied if/when repeat programming processes are required).

Generally, disclosed herein are embodiments of a memory structure. The memory structure can include an array of threshold voltage programmable field effect transistors (VT-programmable FETs) (e.g., ferroelectric field effect transistors (FeFETs) or other suitable VT-programmable FETs suitable for functioning as a bitcell) arranged in columns and rows. The memory structure can further include, for one or more columns of VT-programmable FETs, circuitry including a comparator and at least one voltage driver. The comparator can be configured to perform a comparison of a data output signal from a selected VT-programmable FET in a column and a data input signal and to output a data verification signal based on the comparison. For example, if the data output signal and the data input signal represent the same data value, then the data verification signal can have a first value. If they do not represent the same data value, then the data verification signal can have a second value. A voltage driver can be configured to receive the data verification signal and to selectively apply one specific voltage of multiple different voltages to the source-line and/or to the bit-line for the column, depending upon the data verification signal (i.e., depending upon whether the data verification signal has the first value or the second value).

In some embodiments, such a voltage driver can be configured to facilitate single-bit data storage. In this case, the multiple different voltages can include a programming inhibit voltage and a variable programming assist voltage. The voltage driver can be configured to selectively apply to the source-line and/or the bit-line, the programming inhibit voltage, when the data verification signal has the first value (i.e., when programming has been verified). The voltage driver can further be configured to selectively apply to the source-line and/or the bit-line, the variable programming assist voltage, when the data verification signal has the second value (i.e., when programming has not been verified). The variable programming assist voltage can be adjusted (i.e., can vary) with each repeat programming process required. For example, the VT-programmable FETs can be FeFETs. In this case, the variable programming assist voltage can always be lower than the programming inhibit voltage and can be adjusted down with each repeat programming process required. Specifically, the variable programming assist voltage can be at an initial programming assist voltage level during an initial programming process following an initial verification process where the resulting data verification signal had the second value and can further be at decremental programming assist voltage levels during repeat programming processes following subsequent verification processes where the resulting data verification signals have the second value. Such repeat programming processes with decremental programming assist voltages can be performed until a data verification signal has the first value (i.e., until programming is verified) or until some other condition is met.

In other embodiments, such a voltage driver can be configured to facilitate multi-bit data storage. In this case, the multiple different voltages can include a programming inhibit voltage and two or more different programming assist voltages and that are associated with different multi-bit data values. The voltage driver can be configured to receive both the data input signal and the data verification signal and to selectively apply to the source-line and/or the bit-line, one specific voltage of multiple different voltages depending upon both the data verification signal and the data input signal. Specifically, the voltage driver can be configured to selectively apply to the source-line and/or the bit-line, the programming inhibit voltage, when the data verification signal has the first value (i.e., when programming has been verified). The voltage driver can further be configured to selectively apply to the source-line and/or the bit-line, a specific programming assist voltage of the two or more programming assist voltages when the data verification signal has the second value. For example, the VT-programmable FETs can be FeFETs. As mentioned above, the two or more different programming assist voltages can be associated with different multi-bit data values and in this case can always be lower than the programming inhibit voltage. The specific programming assist voltage applied to the source-line and/or the bit-line can be associated with a specific multi-bit data value represented by the data input signal (i.e., the data input signal can effectively function as a voltage level select signal for the specific multi-bit data value). Optionally, the different programming assist voltages can also be variable (e.g., so that decremental programming assist voltages can be applied if/when repeat programming processes are required to achieve the desired programming).

BRIEF DESCRIPTION OF THE SEVERAL VIEWS OF THE DRAWINGS

The present invention will be better understood from the following detailed description with reference to the drawings, which are not necessarily drawn to scale and in which:

FIG. 3 is a table illustrating an exemplary programming scheme that could be employed using the memory structure FIG. 2C to store multi-bit data values.

DETAILED DESCRIPTION

As mentioned above, threshold voltage (VT) programmable field effect transistors (FETs) are currently being considered for use as bitcells in emerging memory technologies. Such VT-programmable FETs can include, but are not limited to, ferroelectric field effect transistors (FeFETs), charge trap field effect transistors (CTFETs) and floating gate field effect transistors (FGFETs). In VT-programmable FET-based memory circuit, an array of VT-programmable FETs, which function as bitcells, are arranged in columns and rows. During a write operation, a selected VT-programmable FET in a particular column and a particular row can be either programmed or erased as a function of a wordline voltage pulse applied to the gate of that FET through the wordline for a particular row of FETs within the array. For example, in FeFET-based memory circuit, an array of n-type FeFETs can be arranged in columns and rows. Each n-type FeFET can include a source, a drain, a channel between the source and the drain, and a gate adjacent to the channel. During a write operation, a selected FeFET can be either programmed or erased. In either case, the source and drain of the FeFET are typically connected to ground and a wordline voltage pulse on the gate controls whether the selected FeFET is programmed or erased.

Figure 4A:
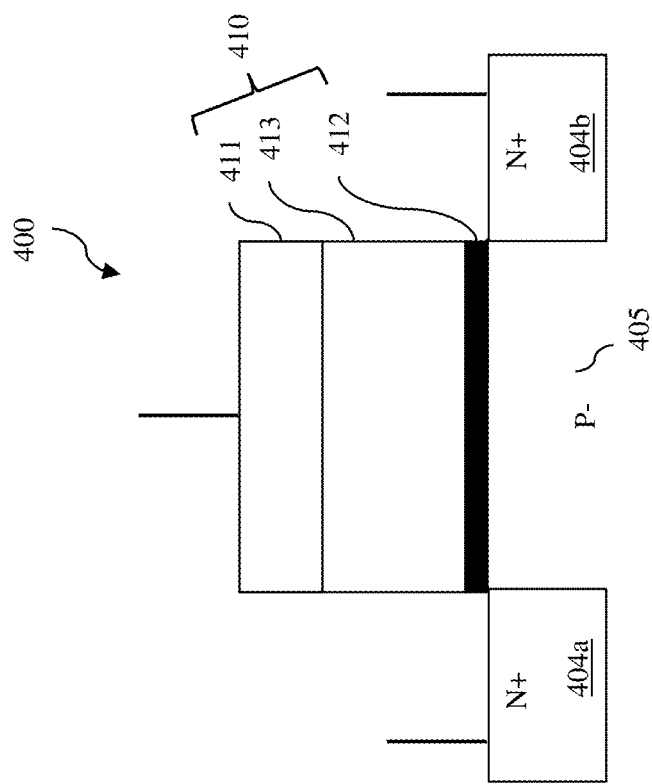
FIG. 4A is a cross-section diagram illustrating an exemplary n-type ferroelectric field effect transistor (FeFET) and FIGS. 4B and 4C illustrate the FeFET of FIG. 4A in programmed and erased states, respectively.

More particularly, FIG. 4A is a cross-section diagram illustrating an exemplary n-type ferroelectric field effect transistor (FeFET) 400. This FeFET 400 includes N+ source/drain regions 404a-404b and a channel region 405 (e.g., a P-channel region), which is positioned between the N+ source/drain regions 404a-404b. The FeFET 400 further includes a gate 410 adjacent to the channel region 405. The gate 410 is a multi-layered structure including, for example, a gate dielectric layer 412 on the channel region 405, a ferroelectric dielectric material layer 413 (e.g., a hafnium oxide layer or some other suitable ferroelectric dielectric material layer) on the gate dielectric layer 412, and a control gate layer 411 (e.g., a metal gate layer) on the ferroelectric dielectric material layer 413. A FeFET-based memory circuit can include an array of bitcells and, particularly, an array of FeFETs (as described above and illustrated in FIG. 4A). The FeFETs can be arranged in columns and rows. Each column can have a corresponding source-line connected to the source regions of all FeFETs in the column and a corresponding bit-line connected to the drain regions of all FeFETs in the column. Each row can have a corresponding wordline connected to the gates of all FeFETs in the row.

Figure 4B:
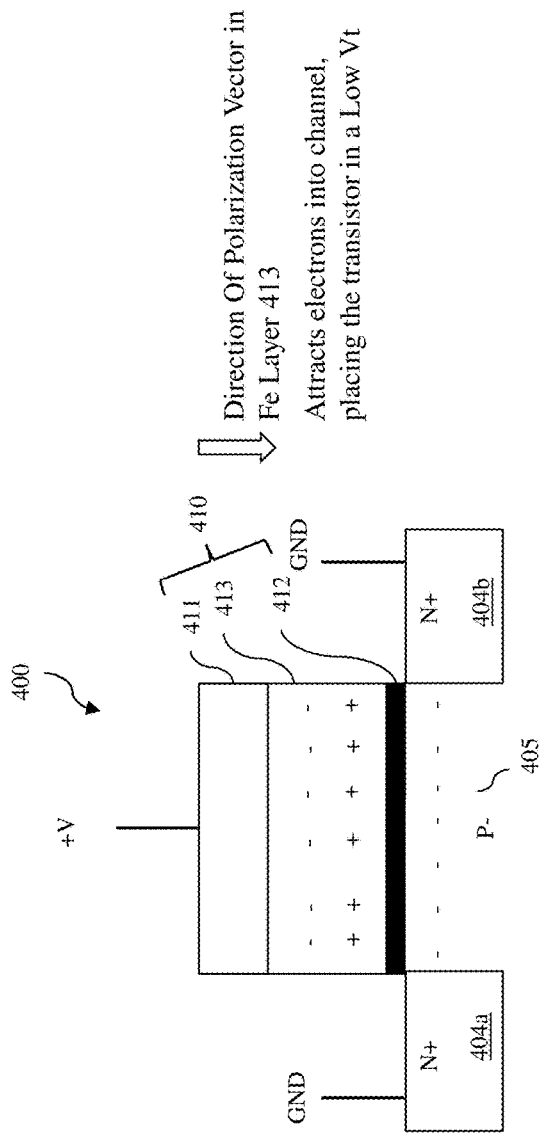
Figure 4C:
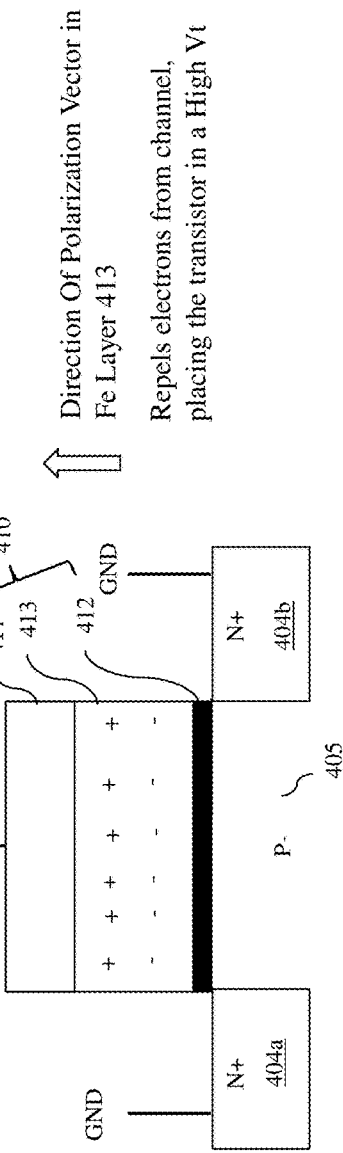

During a write operation directed to a selected FeFET 400 in a given column and a given row of an array in a FeFET-based memory circuit, the FeFET is either programmed, as illustrated in FIG. 4B, or erased, as illustrated in FIG. 4C. In either case, both the source and drain 404a-404b are typically connected to ground (e.g., via a source-line and a bit-line for the column). For single-bit data storage, a relatively high positive wordline voltage pulse can be applied to the gate of a selected FeFET in order to switch polarization to a downward direction and achieve a low threshold voltage (VT) state (also referred to herein as a programmed state) that corresponds to storage of a single-bit data value of 1. For multi-bit data storage (i.e., 2-bit, 3-bit, etc.), one of multiple different positive wordline voltage pulses can be selectively applied to the gate of a selected FeFET to achieve one of multiple different low VTs (also referred to as different programmed states) that correspond to one of multiple different multi-bit data values, respectively. To erase a selected FeFET, a negative wordline voltage pulse can be applied to the gate of the FeFET to achieve the highest VT state (also referred to herein as an erased state) that corresponds to storage of a 0 single-bit data value or an all 0's multi-bit data value. Alternatively, in order to avoid the need for a negative supply voltage, all FeFETs with a block can be concurrently reset/erased through a block erase process. In any case, all write operations (including programming and, if applicable, erasing) directed to a selected FeFET are typically controlled by the wordline voltage pulse on the gate of that selected FeFET since, as mentioned above, the source and drain are both connected to ground. However, due to random variations within the ferroelectric dielectric material layer 413 of the gate 410, the direction of polarization may not uniformly switch in response to a given wordline voltage pulse. Therefore, to accomplish single-bit or multi-bit data storage, repeat programming processes with varying positive wordline voltage pulses and subsequent verification processes are often required, thereby reducing write speed. Additionally, to store different multi-bit data values in different FeFETs in the same row, discrete programming processes with different positive wordline voltages pulses are required.

In view of the foregoing, disclosed herein are embodiments of a memory structure and, particularly, embodiments of a threshold voltage (VT)-programmable field effect transistor-based memory circuit (e.g., a ferro-electric field effect transistor (FeFET)-based memory circuit or some other suitable VT-programmable FET-based memory circuit) that employs source-line and/or bit-line-applied variable programming assist voltages during write operations and, particularly, during programming operations. For single-bit data storage in a selected FeFET of a FeFET-based memory circuit, decremental programming assist voltages can be selectively applied by a voltage driver to the source-line and/or the bit-line connected to the selected FeFET during repeat programming processes when previous attempts at programming have failed. For multi-bit data storage in a selected FeFET of a FeFET-based memory circuit, different programming assist voltages can be associated with different multi-bit data values, respectively, and a specific programming assist voltage can be selectively applied by a voltage driver to the source-line and/or the bit-line connected to the selected FeFET during a programming process to achieve storage of a specific multi-bit data value. Optionally, the different programming assist voltages can also be variable (e.g., so that decremental programming assist voltages can be applied if/when repeat programming processes are required to achieve the desired programming).

Figure 1A:
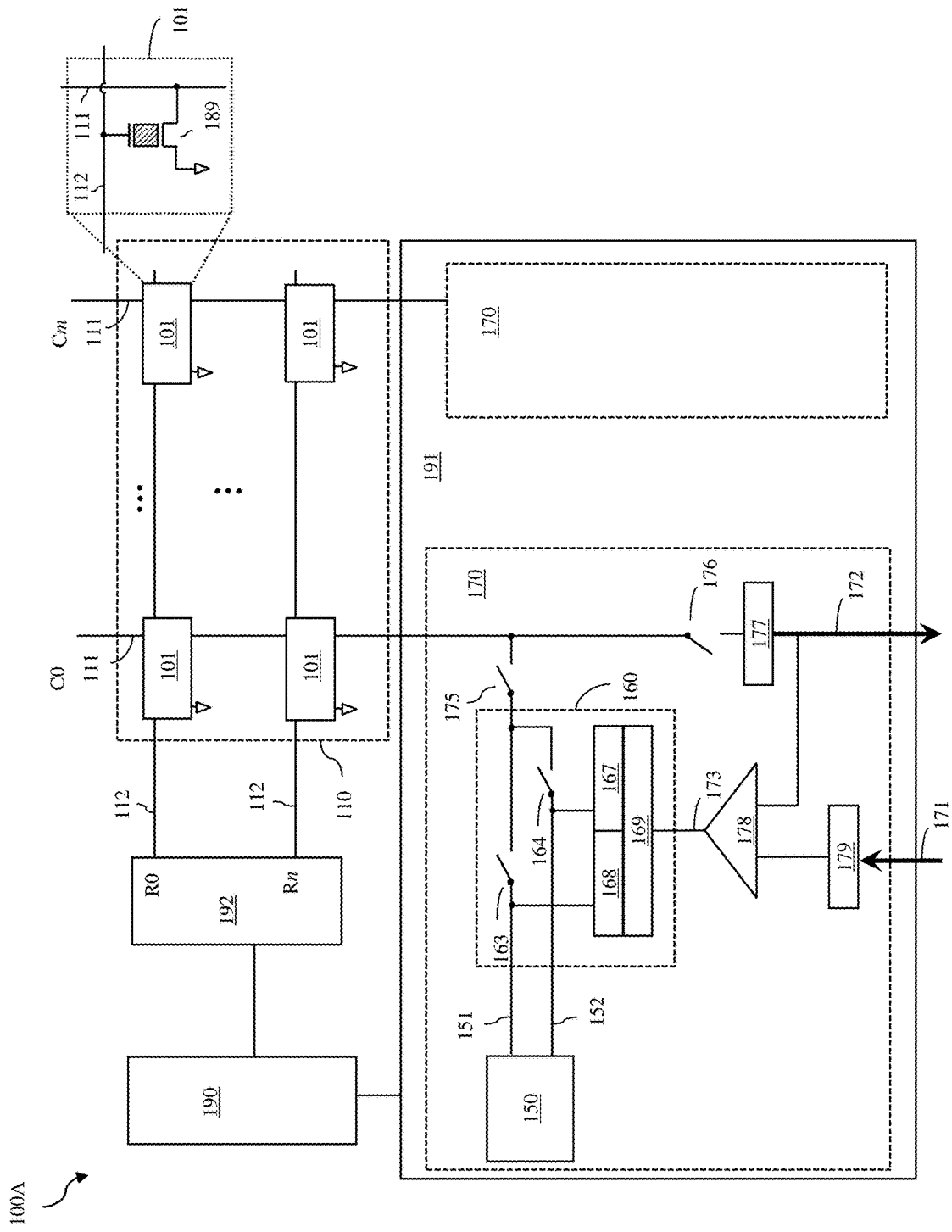
FIGS. 1A-1C are schematic diagrams illustrating embodiments of a memory structure disclosed herein.
Figure 1B:
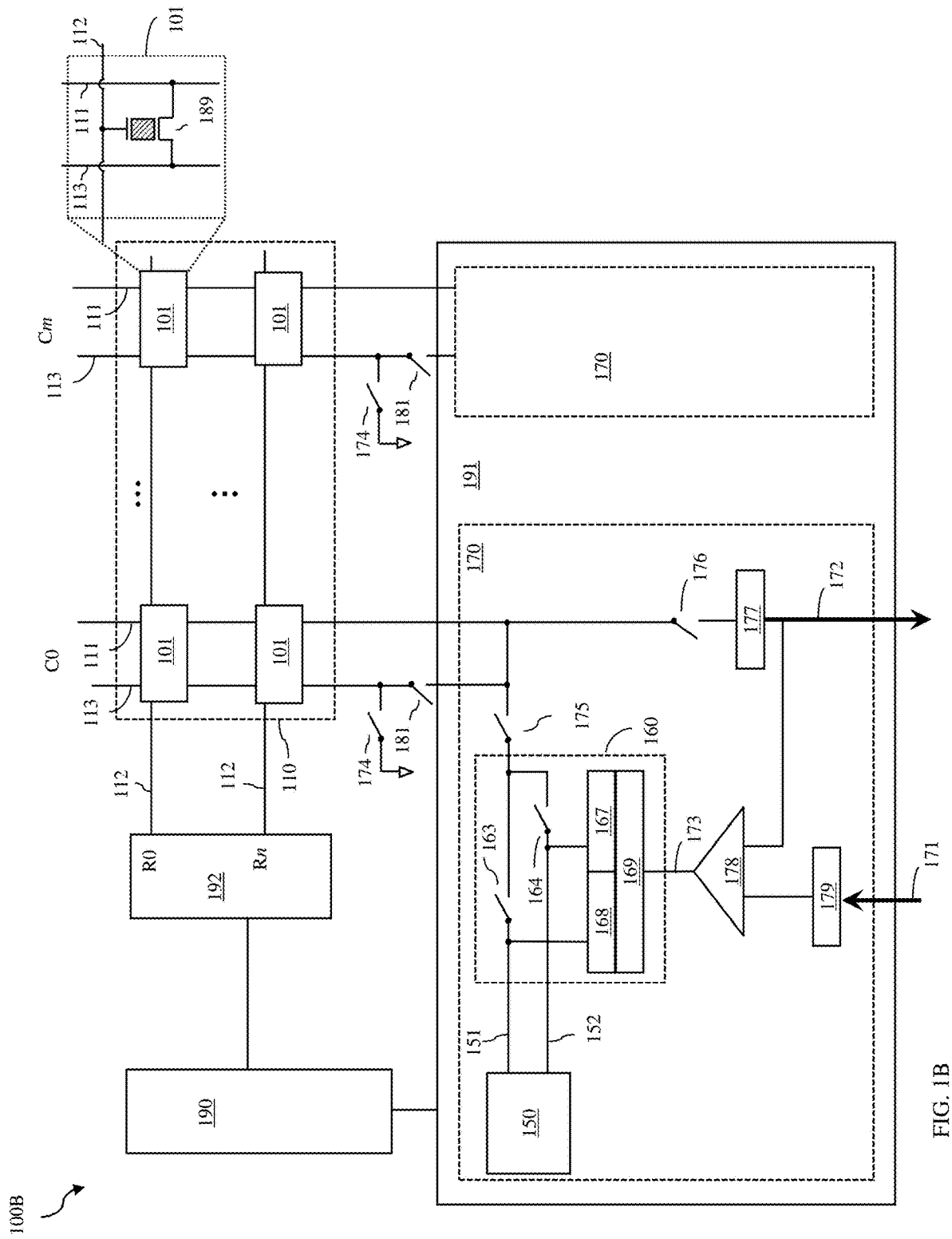
Figure 1C:
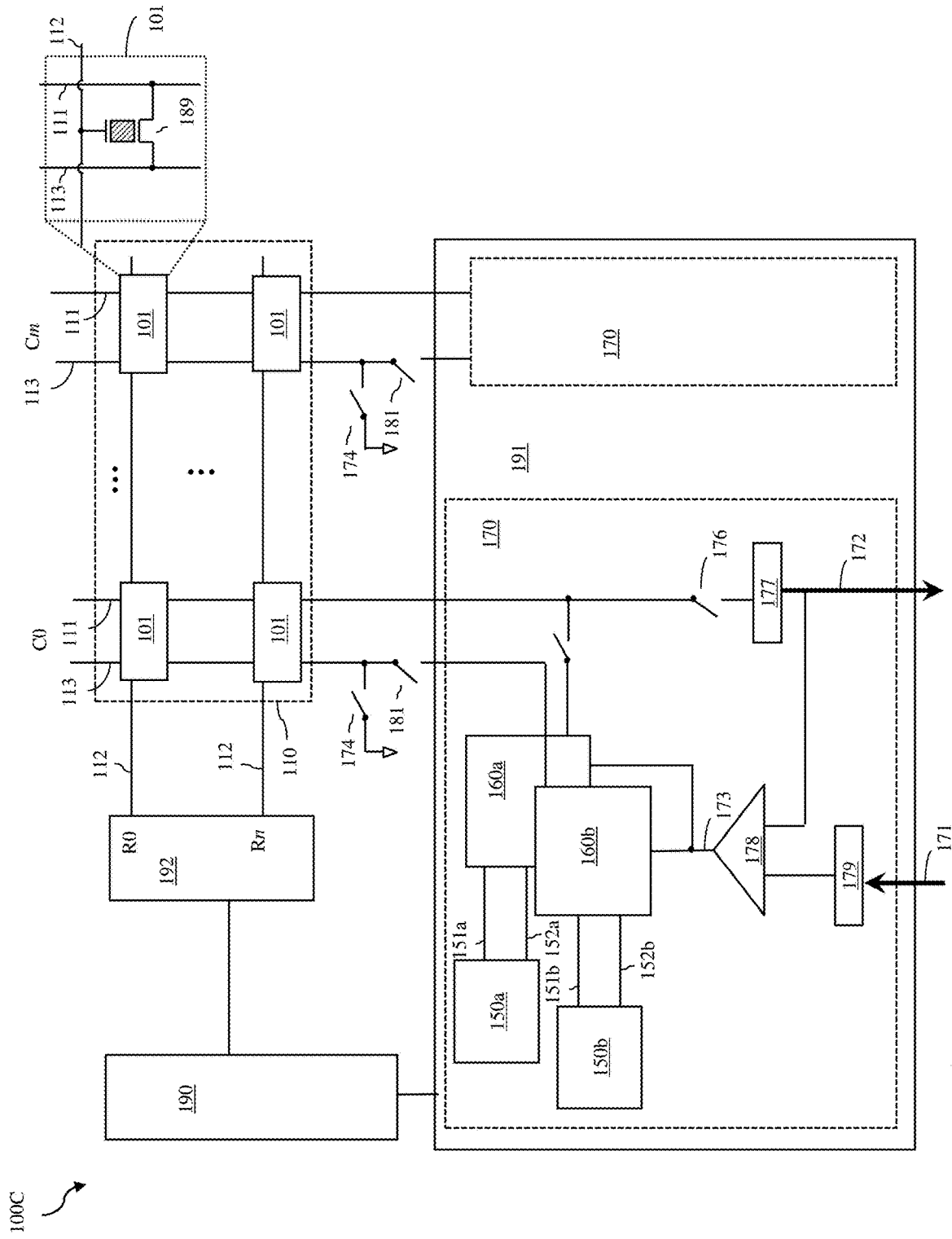
Figure 2A:
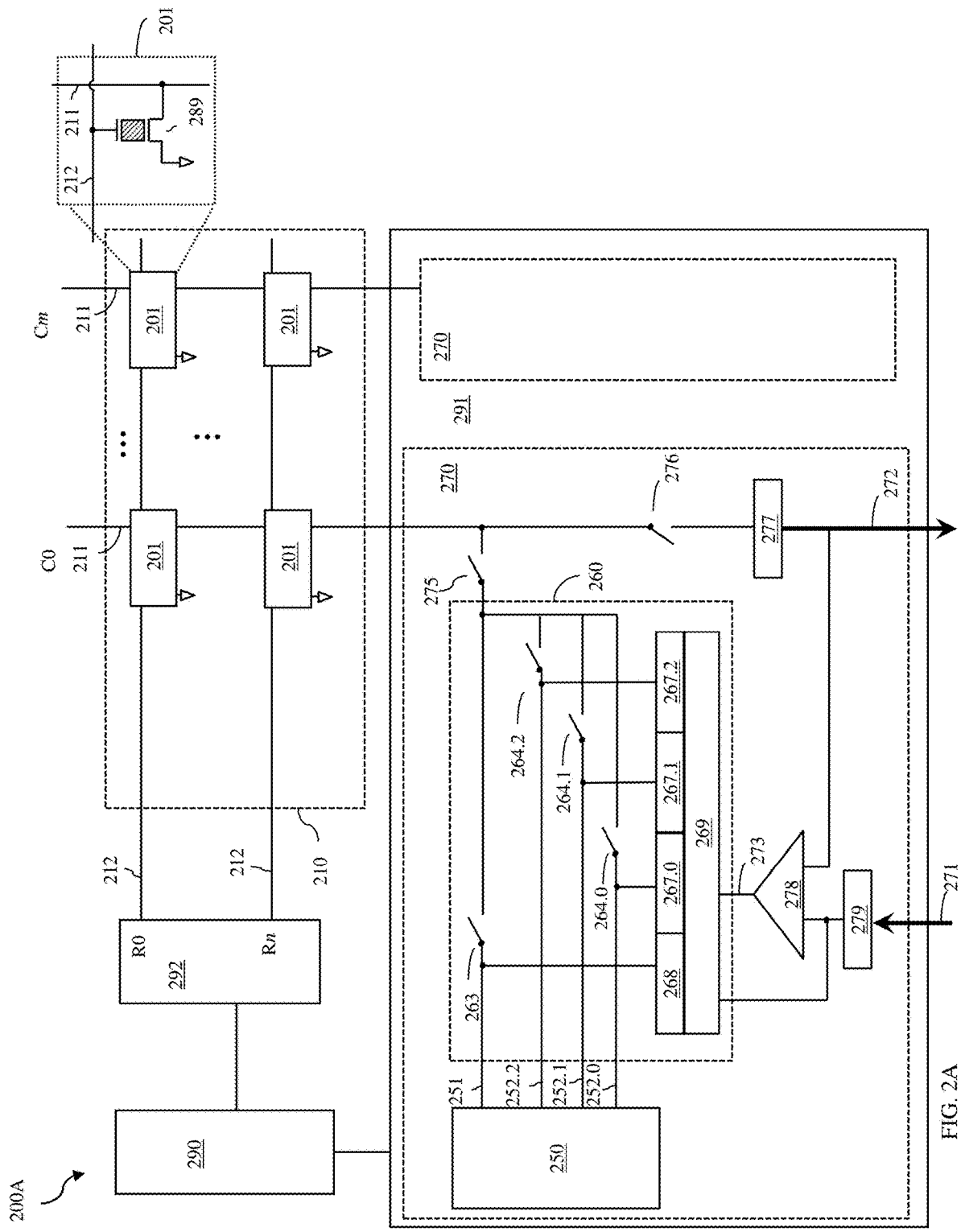
FIGS. 2A-2C are schematic diagrams illustrating additional embodiments of a memory structure disclosed herein.
Figure 2B:
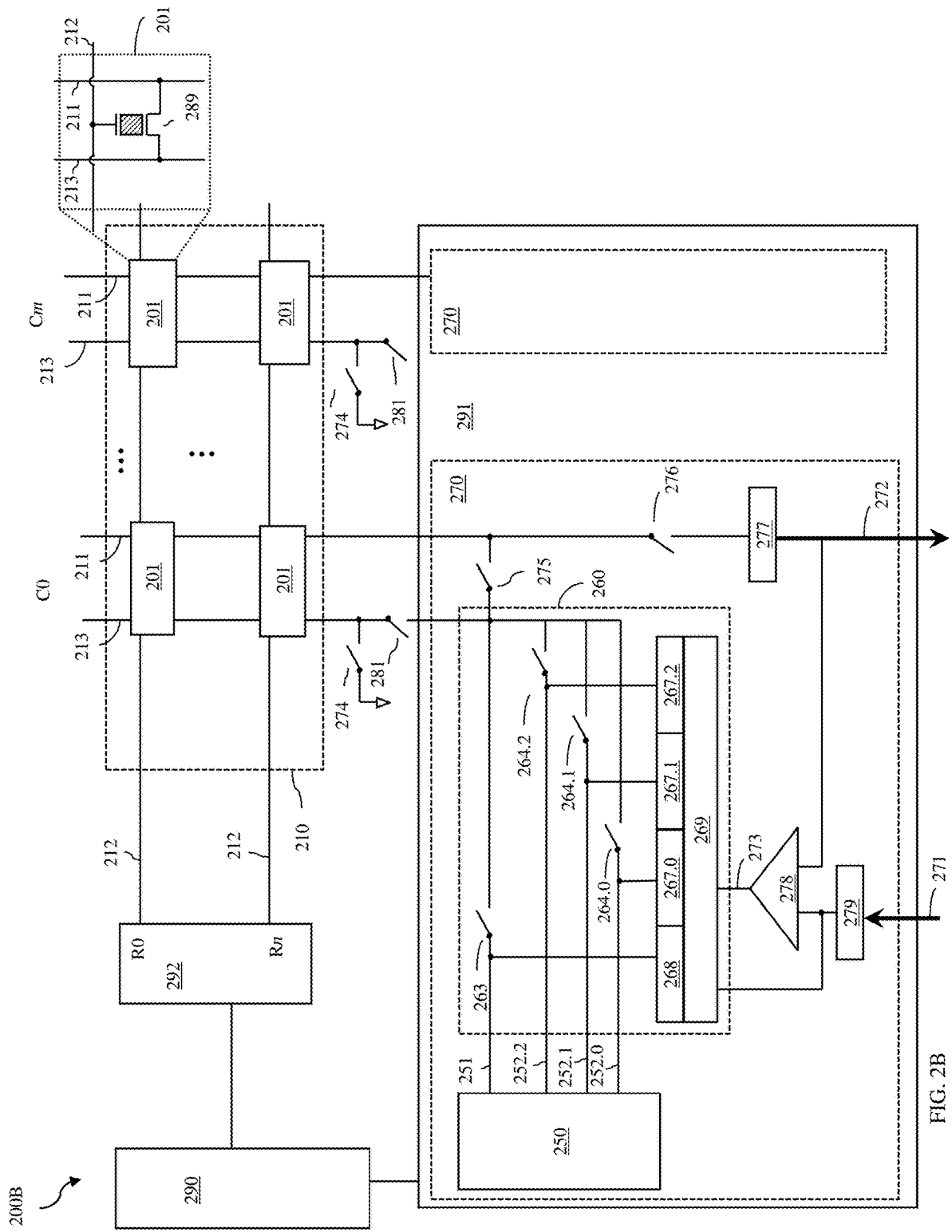
Figure 2C:
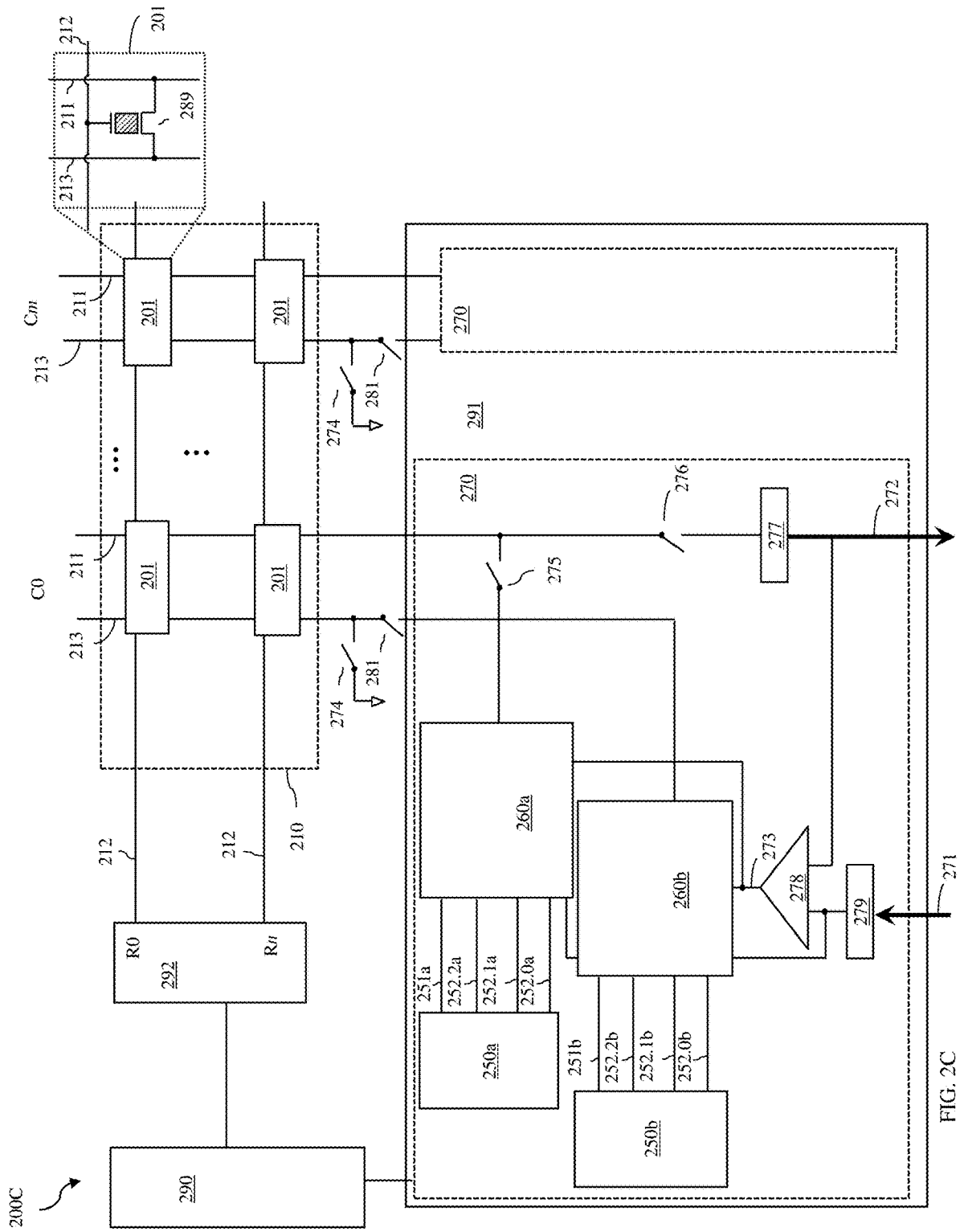

More particularly, disclosed herein are embodiments of a memory structure (e.g., see memory structures 100A-100C of FIGS. 1A-1C, respectively; see also memory structures 200A-200C of FIGS. 2A-2C, respectively). In each of the disclosed embodiments, the memory structure can include an array 110, 210 of bitcells 101, 201 arranged in columns (e.g., see columns C0-Cm) and rows (e.g., see rows R0-Rn). For purposes of illustration, the columns are shown on the drawing sheet as being oriented in the Y-direction (i.e., from the top of the sheet toward the bottom) and the rows are shown on the sheet as being oriented in the X-direction (i.e., from the left-side of the sheet to the right-side). The orientation of the columns and rows of the bitcells as shown in the figures is not intended to be limiting. Alternatively, the columns could be oriented in the X-direction and the rows could be oriented in the Y-direction. In any case, the columns can be essentially perpendicular to the rows with each bitcell 101, 201 being at an intersection between one column and one row.

The bitcells 101, 201 can be threshold voltage programmable field effect transistors (VT-programmable FETs) 189, 289. The VT-programmable FETs 189, 289 can be, for example, ferroelectric field effect transistors (FeFETs). Such FeFETs can be, for example, n-type FeFETs configured essentially the same as the n-type FeFET 400 described above and illustrated in FIG. 4A. That is, each n-type FeFET can include N+ source/drain regions and a channel region (e.g., a P– channel region), which is positioned between the N+ source/drain regions. Each FeFET can further include a gate adjacent to the channel region. The gate can be a multi-layered structure including, for example, a gate dielectric layer on the channel region, a ferroelectric dielectric material layer (e.g., a hafnium oxide layer or some other suitable ferroelectric dielectric material layer) on the gate dielectric layer, and a control gate layer (e.g., a metal gate layer) on the ferroelectric layer. However, it should be understood that the figures and the discussion thereof are not intended to be limiting. Alternatively, the VT-programmable FETs could be p-type FeFETs. Alternatively, the VT-programmable FETs could be some other type of VT-programmable FETs (e.g., charge trap FETs (CTFET), floating gate FET (FGFETs), etc.).

In any case, each VT-programmable FET 189 (e.g., each FeFET) in the memory structures 100A-100C can be configured so as to have at least two states: a low VT state (also referred to herein as a programmed state) corresponding to storage of a single-bit data value of 1; and a high VT state (also referred to herein as an erased state) corresponding to storage of a single-bit data value of 0.

Each VT-programmable FET 289 (e.g., each FeFET) in the memory structures 200A-200C can be configured so as to have more than two states for storing multi-bit data values (i.e., 2-bit, 3-bit, etc.). The states can include multiple different low VT states (also referred to as different programmed states) that correspond to different multi-bit data values, respectively; and a highest VT state (also referred to herein as an erased state) that corresponds to storage of an all 0's multi-bit data value.

In each of the disclosed embodiments, the memory structure 100A-100C, 200A-200C can further include: source-lines 113, 213 for the columns C0-Cm, respectively; bit-lines 111, 211 for the columns C0-Cm, respectively; and wordlines 112, 212 for the rows R0-Rn, respectively. Specifically, each column can have a corresponding source-line connected to the source regions of all FETs in the column and a corresponding bit-line connected to the drain regions of all FETs in the column. Each row can have a corresponding wordline connected to the gates of all FETs in the row. It should be noted that in some embodiments, such as in the memory structure 100A of FIGS. 1A and 1n the memory structure 200A of FIG. 2A, the source-lines for all columns and, thereby the source regions of all the FETs can be connected to ground. Thus, the source-lines are not shown and instead each FET is illustrated as have a source region connected directly to ground.

In each of the disclosed embodiments, the memory structure 100A-100C, 200A-200C can further include a controller 190, 290 and peripheral circuitry 191-192, 291-292 in communication with the controller 190, 290, connected to the array 110, 210, and configured to facilitate bitcell operations (e.g., write operations, including erasing and programming processes, and read operations, including discrete read processes or data storage verification processes performed in conjunction with write operations) in response to control signals from the controller 190, 290.

The peripheral circuitry can include a row control block 192, 292, which is electrically connected to the WLs 112, 212 for the rows. The row control block 192, 292 can be a conventional row control block, which includes row address decode logic and voltage drivers for the wordlines. Memory controllers and row control blocks are well known in the art and, thus, the details thereof have been omitted from this specification in order to allow the reader to focus on the salient aspects of the disclosed embodiments.

The peripheral circuitry can also include a column control block 191, 291, which is electrically connected to bit-lines 111, 211 for the columns and optionally to the source-lines 113, 213 for the columns. The column control block 191, 291, like a conventional column control block, can include column address decode logic and sense circuitry. However, in the disclosed embodiments, the column control block 191, 291 can also be uniquely configured so that, during programming processes directed to selected VT-programmable FET(s) (e.g., to selected FeFET(s)), variable programming assist voltages can be selectively applied to the source-line(s) for the column(s) containing the selected VT-programmable FET(s) (and thereby to the source(s) of the selected VT-programmable FET(s)) and/or to the bit-line(s) for the column(s) containing the selected VT-programmable FET(s) (and thereby to the drain(s) of the selected VT-programmable FET(s)), as discussed in greater detail below.

For example, instead of being configured so that the source and the drain of a selected FeFET are both connected to ground during programming processes as in prior art FeFET-based memory circuits, the column control block 191, 291 of the disclosed memory structure 100A-100C, 200A-200C can include circuitry 170, 270 with voltage driver(s) and the voltage driver(s) can be configured to selectively apply one of multiple possible programming assist voltage(s) to the source-line and/or the bit-line of a column containing a selected VT-programmable FET and, thereby to the source and/or the drain of the selected VT-programmable FET during write operations and, particularly, during programming operations. For single-bit data storage in a selected FeFET of a FeFET-base memory circuit, decremental programming assist voltages can be selectively applied by a voltage driver to the source-line and/or the bit-line for the column containing the selected FeFET during repeat programming processes when previous attempts at programming have failed. For multi-bit data storage in a selected FeFET of a FeFET-based memory circuit, different programming assist voltages can be associated with different multi-bit data values, respectively, and a specific programming assist voltage can be selectively applied by a voltage driver to the source-line and/or the bit-line for the column containing the selected FeFET during a programming process to achieve storage of a specific multi-bit data value. Optionally, multi-bit data storage can further be fine-tuned using decremental programming assist voltages.

More specifically, the column control block 191, 291 can include circuitry 170, 270. In some embodiments, the column control block 191, 291 can include multiple instances of the circuitry 170, 270, where each instance of the circuitry 170, 270 is connected to a corresponding one of the columns in the array, as illustrated. That is, in some embodiments, each instance of the circuitry 170, 270 in the column control block 191, 291 can be column-specific.

Each instance of circuitry 170, 270 can include a pattern latch 179, 279. The pattern latch 179, 279 can be configured to capture a data input signal 171, 271, which indicates a data value to be stored in a selected VT-programmable FET (e.g., a selected FeFET) within a column connected to the circuitry 170, 270. In the memory structures 100A-100C of FIGS. 1A-1C, this data value can be a single-bit data value (i.e., a 1 or a 0). In the memory structures 200A-200C, of FIGS. 2A-2C, this data value can be multi-bit data value (e.g., a 2-bit data value, a 3-bit data value, a 4-bit data value, etc.).

Each instance of the circuitry 170, 270 can further include a sense circuit 177, 277. A switch 176, 276, which is controlled, for example, by a read enable signal from the controller 190, 290 can selectively connect the sense circuit 177, 277 to the bit-line 111, 211 for the column during non-destructive read or data verification processes. The sense circuit 177, 277 can be configured to sense a parameter (e.g., a read voltage or read current) on the bit-line 111, 211 during the read or data verification process and to output a data output signal 172, 272, which is generated based on the parameter and which is representative of the currently stored data value in the selected VT-programmable FET (e.g., the selected FeFET).

Each instance of the circuitry 170, 270 can further include comparator 178, 278. The comparator 178, 278 can be configured to receive, as inputs, the data input signal 171, 271 from the pattern latch 179 and the data output signal 172 from the sense circuit 177, 277. The comparator 178, 278 can further be configured to perform a comparison of the data output signal 172, 272 and the data input signal 171, 271 and to output a data verification signal 173, 273 based on the comparison. For example, if the data output signal 172, 272 is equivalent to the data input signal 171, 271 (i.e., if the data output value and the data input value represent the same data value), thereby indicating that programming has been verified and, more particularly, that the selected VT-programmable FET (e.g., the selected FeFET) currently stores the data value represented by the data input signal, then the data verification signal 173, 273 can have a first value. If they are not equivalent and, particularly, if the target level has not been reached (i.e., if the input and output signals do not represent the same data value), thereby indicating that programming has not been verified and, more particularly, that the selected VT-programmable FET (e.g., the selected FeFET) does not currently store the data value represented by the data input signal, then the data verification signal 173, 273 can have a second value.

Each instance of the circuitry 170, 270 can further include at least one voltage driver 160, 260 configured to receive the data verification signal 173, 273 and to selectively apply one specific voltage of multiple possible voltages from one or more voltage sources (as discussed below) to the source-line 113, 213 and/or to the bit-line 111, 311 for the column, depending upon the data verification signal 173, 273 (i.e., depending upon whether the data verification signal has the first value or the second value).

For example, in some embodiments (e.g., see the memory structure 100A of FIG. 1A or the memory structure 200A of FIG. 2A), each instance of the circuitry 170, 270 can include a single voltage driver 160, 260 configured to receive the data verification signal 173, 273 and, depending upon the data verification signal 173, 273 (i.e., depending upon whether the data verification signal has the first value or the second value), to selectively apply one specific voltage of multiple different voltages to the bit-line 111, 211 for the column during each programming process. In these embodiments, a switch 175, 275, which is controlled, for example, by a write enable signal from the controller 190, 290, can selectively connect the bit-line 111, 211 to the voltage driver.

In other embodiments (e.g., see the memory structure 100B of FIG. 1B or the memory structure 200B of FIG. 2B), each instance of the circuitry 170, 270 can include a single voltage driver 160, 260 configured to receive the data verification signal 173, 273 and, depending upon the data verification signal 173, 273 (i.e., depending upon whether the data verification signal has the first value or the second value), to selectively apply the same specific voltage of multiple possible voltages to both the source-line 113, 213 and bit-line 111, 211 for the column during each programming process. In these embodiments, switches 175, 275 and 173, 273, which are controlled, for example, by a write enable signal from the controller 190, 290, can selectively connect the bit-line 111, 211 and the source-line 113, 213, respectively, to the voltage driver 160, 260. Additionally, a switch 174, 274, which is controlled, for example, by another control signal, can selectively disconnect the source-line 113, 213 from ground when it is connected by the switch 181, 281 to the voltage driver 160, 260.

In still other embodiments (e.g., see the memory structure 100C of FIG. 1C or the memory structure 200C of FIG. 2C), each instance of the circuitry 170, 270 can include a pair of voltage drivers 160a-160b, 260a-260b. Specifically, a voltage driver 160a, 260a can be configured to receive the data verification signal 173, 273 and, depending upon the data verification signal 173, 273 (i.e., depending upon whether the data verification signal has the first value or the second value), to selectively apply one specific voltage of multiple possible voltages to the bit-line 111, 211 for the column during each programming process. An additional voltage driver 160b, 260b can be configured to receive the data verification signal 173, 273 and, depending upon the data verification signal 173, 273 (i.e., depending upon whether the data verification signal has the first value or the second value), to selectively apply another specific voltage of multiple possible voltages to the source-line 113, 213 for the column during each programming process. In these embodiments, switches 175, 275 and 173, 273, which are controlled, for example, by a write enable signal from the controller 190, 290, can selectively connect the bit-line 111, 211 and the source-line 113, 213, respectively, to the voltage driver 160, 260. Additionally, a switch 174, 274, which is controlled, for example, by another control signal, can selectively disconnect the source-line 113, 213 from ground when it is connected by the switch 181, 281 to the voltage driver 160, 260.

In any case, the specific voltage output by a voltage driver of circuitry 170, 270 to a source-line and/or a bit-line can be a programming inhibit voltage 151, 251 when the data verification signal 173, 273 has the first value indicating that programming has been verified and, more particularly, indicating that the selected VT-programmable FET (e.g., the selected FeFET) currently stores the data value represented by the data input signal. The specific voltage output by a voltage driver of circuitry 170, 270 to a source-line or a bit-line can be a programming assist voltage when the data verification signal 173, 273 has the second value indicating that programming has not been verified and, more particularly, indicating that the selected VT-programmable FET (e.g., the selected FeFET) does not currently store the data value represented by the data input signal.

The memory structure embodiments 100A-100C of FIGS. 1A-1C can be configured to facilitate single-bit data storage in each VT-programmable FET. For example, each instance of circuitry 170 of the memory structure embodiments 100A-100C of FIGS. 1A-1C can be configured to selectively apply programming assist voltages to the source-line 113 and/or the bit-line 111 for a column and connected to a selected VT-programmable FET (e.g., a selected FeFET) within that column during repeat programming processes when previous attempts at programming have failed. That is, the applied programming assist voltage can be systematically changed during each repeat programming process.

More particularly, in the memory structures 100A-100B of FIGS. 1A-1B, the circuitry 170 can include a voltage source 150. For purposes of illustration, each instance of circuitry 170 is shown as having a discrete voltage source. However, it should be understood that the figures are not intended to be limiting and that, alternatively, two or more of the instances of circuitry 170 can share the same voltage source 150. The voltage source 150 can be electrically connected to the voltage driver 160 and can be configured to output, to the voltage driver 160, two different voltages including: a programming inhibit voltage 151; and a variable programming assist voltage 152 (as discussed in greater detail below). The voltage driver 160 can include first and second inputs and an output. The voltage driver 160 can be configured to receive from the voltage source 150, the programming inhibit voltage 151 and the variable programming assist voltage 152 at the first input and the second input, respectively, and can further be configured to selectively output either the programming inhibit voltage 151 or the programming assist voltage 152 at the output depending upon the data verification signal 173. For example, the voltage driver 160 can include a first switch 163 connected between the first input and the output and a second switch 164 connected between the second input and the output, respectively. The voltage driver 160 can further include a comparator latch 169. The comparator latch 169 can receive the data verification signal 173 and, based on the data verification signal 173, can assert either a first control signal at a first latch output 168 to turn on the first switch 163 or the second control signal at a second latch output 167 to turn on the second switch 164. Specifically, when the data verification signal 173 has the first value (i.e., when programming has been verified), the comparator latch 169 can assert the first control signal at the first latch output 168 to turn on the first switch 163 and de-assert the second control signal at the second latch output 167 to turn off the second switch 164. When the data verification signal 173 has the second value (i.e., when programming has not been verified), the comparator latch 169 can assert the second control signal at the second latch output 167 to turn on the second switch 164 and can de-assert the first control signal at the first latch output 168 to turn off the first switch 163.

Thus, in the memory structure 100A, when the data verification signal 173 has the first value, the programming inhibit voltage 151 is selectively applied to the bit-line 111 only; whereas when the data verification signal 173 has the second value, the variable programming assist voltage 152 is selectively applied to the bit-line 111 only. In the memory structure 100B, when the data verification signal 173 has the first value, the programming inhibit voltage 151 is selectively applied to both the source-line 113 and the bit-line 111; whereas when the data verification signal 173 has the second value, the variable programming assist voltage 152 is selectively applied to both the source-line 113 and the bit-line 111.

As mentioned above, in the memory structure 100C of FIG. 1C, each instance of the circuitry 170 can include a pair of voltage drivers 160a-160b. In this case, each instance of the circuitry 170 can also include a corresponding pair of voltage sources 150a-150b, as illustrated. However, it should be understood that the figures are not intended to be limiting and that, alternatively, two or more of the instances of circuitry 170 can share the same pair of voltage sources 150a-150b. In any case, each of these voltage sources 150a-150b can be configured essentially the same as the voltage source 150 described above and included in the memory structure 100A or 100B, except that the voltage source 150a can be electrically connected to the voltage driver 160a and thereby to the bit-line 111, whereas voltage source 150b can be electrically connected to the voltage driver 160b and thereby to the source-line 113. Each voltage source 150a-150b can be configured to output a first voltage and, particularly, a programming inhibit voltage (e.g., 151a in the case of the voltage source 150a and 151b in the case of the voltage source 150b). Each voltage source 150a-150b can also be configured to output a variable second voltage and, particularly, a variable programming assist voltage (e.g., 152a in the case of the voltage source 150a and 152b in the case of the voltage source 150b). It should be noted that the programming inhibit voltages 151a-151b will typically be the same and the variable programming assist voltages 152a-152b can also be either the same or different (as discussed in greater detail below). In any case, each voltage driver 160a-160b can include a first input for receiving the programming inhibit voltage, a second input for receiving the variable programming assist voltage, and an output. Each voltage driver 160a-160b can further be configured to selectively output either the received programming inhibit voltage or the received variable programming assist voltage at the output depending upon the same data verification signal 173 (e.g., in essentially the same manner as the voltage driver 160 in the memory structures 100A-100B). In this case, however, when the data verification signal 173 has the first value, the programming inhibit voltage 151a is output to the bit-line 111 from the voltage driver 160*a* and the programming inhibit voltage 151*b* is output to the source-line 113 from the voltage driver 160*b*, whereas when the data verification signal 173 has the second value, the variable programming assist voltage 152*a* is output to the bit-line 111 from the voltage driver 160*a* and the variable programming assist voltage 152*b* is output to the source-line 113 form the voltage driver 160*b*.

In any case, each voltage source 150 of the memory structure 100A, each voltage source 150 of the memory structure 100B, and each voltage source 150*a* and 150*b* of the memory structure 100C can be configured so that the programming inhibit voltage received at the first input of a corresponding voltage driver is sufficient to prevent subsequent loss of the stored data value from the VT-programmable FET to which it is applied (e.g., sufficiently high to prevent subsequent loss of the stored data value from the FeFET to which it is applied) (e.g., during write operations directed to other FETs in the same row). For example, in the case of a FeFET-based memory circuit, the programming inhibit voltage applied by a voltage driver to a source-line and/or a bit-line can be significantly higher than 0V and slightly lower than the wordline voltage pulse applied to the wordline for the row. For example, in some FeFET-based memory structure embodiments, if the wordline voltage pulse is at Vdd and Vdd is at 4V, then the programming inhibit voltage can be at ≥Vdd/2 and the programming assist voltage can be <Vdd/2 (e.g., if Vdd=4V, then the programming inhibit voltage can be 2Vdd/3 or 2.67V and the programming inhibit voltage can be <2Vdd/3).

Additionally, each voltage source 150 of the memory structure 100A, each voltage source 150 of the memory structure 100B, and each voltage source 150*a* and 150*b* of the memory structure 100C can be configured so that the variable programming assist voltage received at the second input of a corresponding voltage driver is one of multiple possible programming assist voltages. Specifically, each voltage source of the memory structures 100A-100C can be configured so that an initial programming assist voltage is output to the second input of a corresponding voltage driver at the initiation of a programming process (i.e., during an initial programming process to write a 1 data value into a selected FET following an initial verification process where the resulting data verification signal had the second value indicating that the currently stored data in the selected FET was not a 1). The initial programming assist voltage can be set, for example, at a nominal programming assist voltage that will still be sufficient, given random process variations, for programming some statistically significant portion of the FETs (e.g., sixty-eight percent, ninety-five percent, etc.). However, due to random process variations at least some FETs may not be programmed during the initial programming process. So, each voltage source can further be configured so that programming assist voltages that are adjusted (i.e., varied) with each repeat programming process required in order to achieve the desired programming. For example, in the case of a FeFET-based memory circuit, a decremental programming assist voltage is output to the second input of the corresponding voltage driver during each repeat programming process following a verification processes where the resulting data verification signal has the second value indicating that previous programming of the selected FeFET has failed. For purposes of this disclosure, a decremental programming assist voltage during a repeat programming process refers to a programming assist voltage that is some set amount lower than that used in any previous programming process.

Generally, programming should begin with programming assist voltage(s) on the SL and/or the BL selected to achieve programming of some statistically significant portion of all devices (e.g., 68%, 95%, etc.). For FeFET programming, decrements with each repeat programming process can be set depending on the desired resolution. For example, for 2-bit storing, relatively high decrement values could be used. For 3-bit or greater storing, lower decrement values could be used. It should be understood that with smaller decrement values, programming will be more precise, but a greater number of repeat programming processes will be required to achieve all target VT values. For example, if the wordline voltage pulse is set at Vdd, Vdd should be sufficiently high to program all FETs to the low threshold voltage (e.g., 4V) when no programming assist voltage (i.e., 0V) is employed. In this case, the programming assist voltage could start, for example, at approximately Vdd/10 (e.g., 0.4V) and with each repeat programming process could be decremented by approximately Vdd/100 (e.g., 0.04V). Thus, after only 10 program cycles, maximum condition of a Vdd (4V) wordline pulse and a programming assist voltage of 0V would be reached. To avoid complexity associated with have a negative voltage supply the lowest possible programming assist voltage can be 0V.

It should be noted that voltage regulator(s) and, particularly, digital-to-analog converter (DAC)-based voltage regulator(s) could be incorporated into the memory structures 100A-100C for use as voltage source(s) 150 and, as described above, configured to output both a programming inhibit voltage 151 and a variable programming assist voltage 152, which is automatically adjusted (e.g., decremented) when repeat programming is required for data storage. Such DAC-based voltage regulators are well known in the art and, thus, the details thereof have been omitted form this specification in order to allow the reader to focus on the salient aspects of the disclosed embodiments.

As mentioned above, a conventional programming process to store a 1 data value in a FeFET involves application of a relatively high positive wordline voltage pulse (e.g., at Vdd) to the gate of the selected FeFET, while the source and drain are connected to ground (e.g., 0V) via the source-line and bit-line, respectively. This conventional FeFET programming process uses only vertical voltage driven control of polarization switching to adjust the VT of the selected FeFET and thereby switch the stored data value. Furthermore, repeat programming processes with varying incrementally higher wordline voltage pulses and subsequent verification processes may be required to achieve the desired programming. Thus, in FeFET-based memory circuits, the circuitry 170 allows for a combination of both vertical and lateral voltage driven control of polarization switching through the wordline and the source-line and/or the bit-line and thereby allows for fine-tuned control over the programmed area in the ferroelectric dielectric material. The lateral voltage driven control can be one-sided meaning a voltage driver applies the programming assist voltage to the source-line or the bit-line only during each programming process (e.g., as in the memory structure 100A), two-sided and symmetric meaning the voltage driver applies the same programming assist voltage to both the source-line and the bit-line during each programming process (e.g., as in the memory structure 100B), or two-sided and optionally asymmetric meaning that two different voltage drivers apply the same or different programming assist voltages to the source-line and the bit-line during each programming process (e.g., as in the memory structure 100C).

It should be noted that in the above-described memory structure embodiments 100A-100C the row control block 192 can be configured so that the programming processes (including the initial programming process and any repeat programming processes) are all performed using a fixed-level wordline voltage pulse (i.e., using the same wordline voltage pulse). Alternatively, the row control block 192 can be configured so that the programming processes (including the initial programming process and any repeat programming processes) are performed using incremental wordline voltage pulses (e.g., using wordline voltage pulses that are increased with subsequent programming process). Alternatively, the row control block 192 can be configured so that the programming processes (including the initial programming process and any repeat programming processes) are performed using a fixed-level wordline voltage pulse with all possible decremental programming assist voltages and, if programming fails, starting over with a higher fixed-level wordline voltage pulse, and so on.

In any case, in the memory structure embodiments 100A-100C, the programming processes (including the initial programming process and the repeat programming processes, if necessary) can be performed until the data verification signal has the first value (i.e., until programming is verified) or until some other condition is met.

As discussed above, the memory structure embodiments 100A-100C are optimally employed for single-bit data storage. However, it should be understood that the description is not intended to be limiting. Alternatively, the memory structure embodiments 100A-100C could be employed for multi-bit data storage. Specifically, different verify levels could be employed during the verification processes so that the memory structure embodiments 100A-100C could, alternatively, be employed for multi-bit data storage. In this case, if multiple VT-programmable FETs (e.g., multiple FeFETs) are to be programmed to different target VTs in order to store different multi-bit data values therein, then all of them can be gradually programmed and verified with a first verify level (closest to HVT). If, during verification, it is determined that particular VT-programmable FET(s) have reached it/their target VT, the particular VT-programmable FETs will receive the programming inhibit voltage during repeat programming operations. During each repeat programming operation, unprogrammed VT-programmable FETs that have yet to meet their target VT level will be verified using a different verify level (e.g., a bit closer towards fully programmed low VT level). Repeated programming and verification can continue until all of the VT-programmable FETs have reached their target VTs or until some other specified condition is met. It should be noted that such multi-bit data storage embodiment would not necessarily result in faster or more accurate programming.

The memory structures 200A-200C of FIGS. 2A-2C are specifically configured to facilitate multi-bit data storage and, more particularly, for selectively applying different programming assist voltages associated with different multi-bit data values, respectively, to the source-line and/or the bit-line connected to a selected VT-programmable FET (e.g., a selected FeFET) during a programming process to achieve storage of a specific multi-bit data value.

More particularly, in each instance of the circuitry 270 of the memory structures 200A-200C of FIGS. 2A-2C, the voltage driver(s) can be configured to receive both the data input signal 271 and the data verification signal 273 and to selectively apply to the source-line 213 and/or the bit-line 211 of a column, one specific voltage of multiple different voltages depending upon both the data verification signal 273 and the data input signal 271. Specifically, the voltage driver(s) can be configured to selectively apply to the source-line 213 and/or the bit-line 211 of a column, a programming inhibit voltage 251, when the data verification signal has the first value (i.e., when programming has been verified). The voltage driver(s) can further be configured to selectively apply to the source-line 213 and/or the bit-line 211 of a column, a specific programming assist voltage when the data verification signal 273 has the second value. In this case, different programming assist voltages can be associated with different multi-bit data values and the specific programming assist voltage applied to the source-line and/or the bit-line can be associated with a specific multi-bit data value represented by the data input signal 271. Thus, the data input signal 271 can effectively function as a voltage level select signal for the specific multi-bit data value.

More specifically, in the memory structures 200A-200B of FIGS. 2A-2B, the circuitry 270 can include a voltage source 250. For purposes of illustration, each instance of circuitry 170 is shown as having a discrete voltage source. However, it should be understood that the figures are not intended to be limiting and that, alternatively, two or more of the instances of circuitry 170 can share the same voltage source 250. This voltage source 250 can be electrically connected to the voltage driver 260 and can be configured to output, to the voltage driver 260, multiple different voltages including: a programming inhibit voltage 251; and multiple programming assist voltages 252.0-252.1, which are associated with different multi-bit data values (as discussed in greater detail below). For purposes of illustration, three different programming assist voltages 252.0-252.1 are shown in the figures as being output from the voltage source 250 and received by the voltage driver 260. However, it should be understood that the figures are not intended to be limiting. Alternatively, any number of two or more different programming assist voltages can be output from the voltage source 250 and received by the voltage driver 260. By varying the number, the number bits in the multi-bit data values stored can be varied.

In any case, the voltage driver 260 can include a first input for receiving the programming inhibit voltage 251, multiple second inputs for receiving the multiple different programming assist voltages 252.0-252.2, respectively, and an output. The voltage driver 260 can be configured to selectively output either the programming inhibit voltage 251 or one of the different programming assist voltages 252.0-252.2 at the output depending upon both the data verification signal 273 and the data input signal 271. That is, the voltage driver 260 can include a first switch 263 connected between the first input and the output. The voltage driver 260 can further include multiple second switches 264.0-264.2 connected between the second inputs and the output, respectively. The voltage driver 260 can further include a comparator latch 269. The comparator latch 269 can receive the data verification signal 273 and the data input signal 271 and, based on the data verification signal 273 and the data input signal 271, can output a first control signal at a first latch output 268 to the first switch 263 and second control signals at second latch outputs 267.0-267.2 to the second switches 264.0-264.2, respectively. When the data verification signal 273 has the first value (i.e., when programming has been verified), the comparator latch 269 can assert the first control signal at the first latch output 268 to turn on the first switch and de-assert all of the second control signals at the second latch outputs 267.0-267.2 to turn off all the second switches 264.0-264.2. When the data verification signal 273 has the second value (i.e., when programming has not been verified), the comparator latch 269 can de-assert the first control signal at the first latch output 268 to turn off the first switch 263. Furthermore, depending upon the data input signal 271, the comparator latch 269 can assert a specific one of the second control signals at a specific one of the second latch outputs to turn on a specific one of the second switches and can de-assert all other second signals to turn off all other second switches. The asserted second control signal can control the specific second switch that will cause a specific programming assist voltage, which is associated with a specific multi-bit data value represented by the data input signal 271, to be output by the voltage driver 260 and applied to the source-line and/or the bit-line of the column containing the selected VT-programmable FET (e.g., the selected FeFET). In other words, the data input signal 271 effectively functions as a voltage level select signal for the specific multi-bit data value.

It should be noted that in the memory structure 200A, when the data verification signal 273 has the first value, the programming inhibit voltage 251 is selectively applied to the bit-line 211 only of the column containing the selected VT-programmable FET (e.g., the selected FeFET); whereas when the data verification signal 273 has the second value, a data input signal-dependent one of the multiple programming assist voltages 252.0-252.2 is selectively applied to the bit-line 211 only of the column containing the selected VT-programmable FET (e.g., the selected FeFET). In the memory structure 200B, when the data verification signal 273 has the first value, the same programming inhibit voltage 251 is selectively applied to both the source-line 213 and the bit-line 211 of the column containing the selected VT-programmable FET (e.g., the selected FeFET); whereas when the data verification signal 273 has the second value, the same data input signal-dependent one of the multiple programming assist voltages 252.0-252.2 is selectively applied to both the source-line 213 and the bit-line 211 of the column containing the selected VT-programmable FET (e.g., the selected FeFET).

As mentioned above, in the memory structure 200C of FIG. 2C, each instance of the circuitry 270 can include a pair of voltage drivers 260a-260b. In this case, each instance of the circuitry 270 can also include a corresponding pair of voltage sources 250a-250b, as illustrated. However, it should be understood that the figures are not intended to be limiting and that, alternatively, two or more of the instances of circuitry 270 can share the same pair of voltage sources 250a-250b. In any case each of the voltage sources 250a-250b can be configured essentially the same as the voltage source 250 described above and included in the memory structure 200A or 200B, except that the voltage source 250a can be electrically connected to the voltage driver 260a and thereby to the bit-line 211 of a column, whereas voltage source 250b can be electrically connected to the voltage driver 260b and thereby to the source-line 213 of the same column.

Each voltage source 250a-250b can be configured to output a programming inhibit voltage (e.g., 251a in the case of the voltage source 250a and 251b in the case of the voltage source 250b) to the corresponding voltage driver 260a-260b. Each voltage source 250a-250b can also be configured to output multiple different programming assist voltages (e.g., 252.0a-252.2a in the case of the voltage source 250a and 252.0a-252.2a in the case of the voltage source 250b) to the corresponding voltage driver 260a-260b. For purposes of illustration, three different programming assist voltages 252.0a-252.1a, 252.0b-252.2b are shown in the figures as being output from each voltage source 250a-250b and received by each voltage driver 260a-260b. However, it should be understood that the figures are not intended to be limiting. Alternatively, any number of two or more different programming assist voltages can be output from each voltage source and received by each voltage driver. By varying the number of programming assist voltages available, the number bits in the multi-bit data values stored in each VT-programmable FET (e.g., in each FeFET) can be varied. In this case, different combinations of the different programming assist voltages 252.0a-252.2a and 252.0b-252.2b can be applied to the bit-line 211 and the source-line 213 of the column containing the selected VT-programmable FET (e.g., the selected FeFET) by the different voltage drivers 260a-260b and each combination of programming assist voltages can be associated with a different multi-bit data values.

It should be noted that programming inhibit voltages 251a-251b from the different voltage sources 250a-250b, respectively, will typically be the same (but could be different) and additionally the different programming assist voltages 252.0a-252.2a and 252.0b-252.2b from the different voltage sources 250a-250b will typically be the same (but could be different). In any case, each voltage driver 260a-260b can include a first input for receiving a programming inhibit voltage, multiple second inputs for receiving different programming assist voltages, and an output. Each voltage driver 260a-260b can further be configured to selectively output either the received programming inhibit voltage or one of the received programming assist voltages at the output depending upon the data verification signal 273 and the data input signal 271. Thus, in the memory structure 200C, when the data verification signal 273 has the first value, the programming inhibit voltage 251a is selectively applied to the bit-line 211 of the column containing the selected VT-programmable FET (e.g., the selected FeFET) and the programming inhibit voltage 251b is selectively applied to the source-line 213 of the column containing the selected VT-programmable FET (e.g., the selected FeFET); whereas when the data verification signal 273 has the second value, some combination of data input signal-dependent programming assist voltages are selectively applied to the bit-line 211 and the source-line 213 of the column containing the selected VT-programmable FET (e.g., the selected FeFET). The programming assist voltages can be symmetrically or asymmetrically applied in order to achieve the desired programming. That is, depending upon the multi-bit data value being stored, the same programming assist voltages may be applied to the source-line and the bit-line by the different voltage drivers or different programming assist voltages may be applied to the source-line and the bit-line by the different voltage drivers.

In any case, each voltage source 250 of the memory structure 200A, each voltage source 250 of the memory structure 200B, and each voltage source 250a and 250b of the memory structure 200C can be configured so that the programming inhibit voltage received at the first input of the corresponding voltage driver is sufficient to prevent subsequent loss of the stored data value from the VT-programmable FET that receives the programming inhibit voltage (e.g., sufficiently high to prevent subsequent loss of the stored data value from a FeFET that receives the programming inhibit voltage). For example, in the case of a FeFET-based memory circuit, the programming inhibit voltage applied by a voltage driver to a source-line and/or a bit-line can be significantly higher than 0V and slightly lower than the wordline voltage pulse applied to the wordline for the row containing the FeFET during programming. For example, in some FeFET-based memory structure embodiments, if the wordline voltage pulse is at Vdd and Vdd is at 4V, then the programming inhibit voltage can be at ≥Vdd/2 and the programming assist voltage can be <Vdd/2 (e.g., if Vdd=4V, then the programming inhibit voltage can be 2Vdd/3 or 2.67V and the programming assist voltage can be <2Vdd/3).

Additionally, each voltage source 250 of the memory structure 200A, each voltage source 250 of the memory structure 200B, and each voltage source 250a and 250b of the memory structure 200C can be configured so that the programming assist voltages received at the second inputs of the voltage driver are all different from the programming inhibit voltage. For example, in the case of a FeFET-based memory circuit the programming assist voltages can all less than the programming inhibit voltage. For example, in some embodiments, a first level programming assist voltage can be 0V, a second level programming assist voltage can be greater than 0V but significantly less than Vdd (e.g., Vdd/10) and a third level programming assist voltage can be greater than the second level programming assist voltage but still significantly less than Vdd (e.g., Vdd/4).

It should be noted that digitally adjustable and controllable voltage regulators with multiple taps or, alternatively, multiple independent voltage regulators could be incorporated into the memory structures 200A-200C for use as voltage source(s) 250 and, as described above, configured to output a programming inhibit voltage 251 and also multiple different programming assist voltages 252.0-252.1 suitable for achieving different VTs during programming and, thereby different storage of different multi-bit data values. Such voltage regulators that regulate the voltage from a main supply or, alternatively, that upconvert the voltage from a charge pump source are well known in the art and, thus, the details thereof have been omitted form this specification in order to allow the reader to focus on the salient aspects of the disclosed embodiments.

As mentioned above, a conventional programming process to store a multi-bit data value in a selected FeFET of a FeFET-base memory circuit involves application of a particular relatively high positive wordline voltage pulse to the gate of the selected FeFET, while the source and drain are connected to ground via the source-line and bit-line respectively. This conventional programming process uses only vertical voltage driven control of polarization switching. Specifically, this conventional programming process is designed so that the positive wordline voltage pulse on the gate alone causes polarization of the ferroelectric dielectric material to switch in order to achieve a particular low threshold voltage (VT) state, which corresponds to storage of a particular multi-bit data value. Different positive gate voltage pulses are required to achieve different low threshold voltage states and, thereby to achieve programming of different multi-bit data values. Thus, with the conventional programming process, two FeFETs in the same row cannot be concurrently programmed to store different multi-bit data values.

In embodiments of the memory structures 200A-200C configured as FeFET-based memory circuits (i.e., where the VT-programable FETs 289 are specifically FeFETs), the circuitry 270 allows for a combination of both vertical and lateral voltage driven control of polarization switching through the wordline and the source-line and/or the bit-line. The lateral voltage driven control can be one-sided meaning a voltage driver applies the programming assist voltage to the source-line or the bit-line only during each programming process (e.g., as in the memory structure 200A), two-sided and symmetric meaning the voltage driver applies the same programming assist voltage to both the source-line and the bit-line during each programming process (e.g., as in the memory structure 200B), or two-sided and optionally asymmetric meaning that two different voltage drivers apply the same or different programming assist voltages to the source-line and the bit-line during each programming process (e.g., as in the memory structure 200C). Because of the ability to employ lateral voltage driven control, in the memory structures 200A-200C, the same fixed-level wordline voltage pulse could be applied to the wordline for a row regardless of the multi-bit data value being stored in any given FeFET within the row. Thus, two or more of the FeFETs in the same row could be concurrently programmed to store the same or different multi-bit data values.

FIG. 3 is a table illustrating a programming scheme that could be employed using the memory structure 200C of FIG. 2C for storing multi-bit data values in FeFETs. Each voltage source 250a-250b can supply each voltage driver 260a-260b with the same programming inhibit voltage and the same programming assist voltages of, for example, Vdd/n, . . . , to 0V. Any given FeFET can be programmed to store the highest multi-bit data value (i.e., an all 1's data value) by applying a Vdd-level wordline voltage pulse to the wordline for the row containing the FeFET and by using the voltage drivers 260a-260b to selectively apply the lowest level programming assist voltages (e.g., 0V and 0V) to the source-line and the bit-line, respectively, for the column containing the FeFET. Any given FeFET can be programmed to store other multi-bit data values by applying a Vdd-level wordline voltage pulse to the wordline for the row containing the FeFET and by using the voltage drivers 260a-260b to selectively apply the same programming assist voltages (referred to herein as symmetric sub-programming) other than 0V and 0V or different programming assist voltages (referred to herein as asymmetric sub-programming) to the source-line and the bit-line, respectively, for the column containing the FeFET.

For example, consider a memory structure 200C where 3-bit data values are stored in the FeFETs and where Vdd=4V. Each voltage source 250a-250b can supply each voltage driver 260a-260b with the same programming inhibit voltage 251a-251b of 2Vdd/3 and with the same three programming assist voltages 252.0a-252.2a, 252.0b-252.2b of, for example, Vdd/4=1.0V, Vdd/10=0.4V, and 0V. Any given FeFET can be programmed to store the highest 3-bit data value (i.e., 111) by applying a 4V-wordline voltage pulse to the wordline for the row containing the FeFET and by using the voltage drivers 260a-260b (i.e., 0V and 0V) to the source-line and the bit-line, respectively, for the column containing the FeFET. Any given FeFET can be programmed to store other 3-bit data values (e.g., 110, 101, 011, etc.) by applying a 4V-wordline voltage pulse to the wordline for the row containing the FeFET and by using the voltage drivers 260a-260b to selectively apply the same programming assist voltages (referred to herein as symmetric sub-programming) other than 0V and 0V (e.g., 0.4V and 0.4V or 1.0V and 1.0V) or different programming assist voltages (referred to herein as asymmetric sub-programming) (e.g., 0V and 0.4V, 0V and 1V, and 0.4V and 1V) to the source-line and the bit-line, respectively, for the column containing the FeFET.

It should be noted that in the memory structures 200A-200C of FIGS. 2A-2C the programming assist voltage(s) output by the voltage source(s) during an initial programming process can be set so as to be sufficient, given random process variations, for programming some statistically significant portion of VT-programmable FETs, such as FeFETs, (e.g., sixty-eight percent, ninety-five percent, etc.) so as to have a specific threshold voltage in order to store a specific multi-bit data value. However due to random process variations, some VT-programmable FETs (e.g., some FeFETs) may not be programmed as desired. Therefore, circuitry 270 can be configured so that, following each programming process directed to a selected VT-programmable FET (e.g., a selected FeFET), a subsequent verification process is performed during which the comparator 278 compares a data output signal 272 from the sense circuit 277 to the data input signal 271 and outputs a data verification signal 273. If the data verification signal 273 has the first value (indicating that programming has been verified), then programming inhibit voltage(s) can be output by the voltage driver(s) to the source-line and/or the bit-line. However, if the data verification signal 273 has the second value (indicating that the previous programming has failed), repeat programming processes can be performed.

For repeat programming processes, the memory structure 200A-200C and, particularly, the row control block 292 thereof can be configured so that any required repeat programming process is performed using an incremental wordline voltage pulse (i.e., a wordline voltage pulse that has been adjusted up) along with the same source-line and/or bit-line-applied programming assist voltage(s) used during the previous attempts at storing the specific multi-bit data value.

Alternatively, for repeat programming processes, each voltage source 250 in the memory structure 200A of FIG. 2A, each voltage source 250 of the memory structure 200B of FIG. 2B, and each of the voltage sources 250a-250b of the memory structure 200C of FIG. 2C can be configured to that each of the different programming assist voltages, which are output to the second inputs of a corresponding voltage driver, are variable programming assist voltages. That is, as with the variable programming assist voltage output by each voltage source in the memory structures 100A-100C, the multiple different programming assist voltages output by each voltage source in circuitry 270 of the memory structures 200A-200C can also be variable. That is, each voltage source in the memory structures 200A-200C can optionally be configured so that initial programming assist voltages are output to the second inputs of the corresponding voltage drivers at the initiation of a programming process (i.e., during an initial programming process to write a specific multi-bit data value into a selected FeFET following an initial verification process where the resulting data verification signal had the second value). Additionally, each voltage source can further be configured so that programming assist voltages that are adjusted (i.e., varied) with each repeat programming process required in order to achieve the desired programming. For example, in the case of a FeFET-based memory circuit, decremental programming assist voltages are output to the second inputs of the corresponding voltage driver during each repeat programming process following a verification processes where the resulting data verification signal has the second value indicating that previous programming has failed.

As discussed above with regard to single-bit programming, multi-bit programming can similarly begin with programming assist voltage(s) applied to the SL and/or BL of a selected VT-programmable FET to achieve a target VT level in some statistically significant portion of all devices (e.g., 68%, 95%, etc.). Decrements with each repeat programming process can be set depending on the desired resolution. For example, for 2-bit storing, relatively high decrement values could be used. For 3-bit or greater storing, lower decrement values could be used. It should be understood that with smaller decrement values, programming will be more precise, but a greater number of repeat programming processes will be required to achieve the target VT values. In other words, there will be a tradeoff between resolution and speed. For example, using the memory structure 200C of FIG. 2C, starting conditions for the different VT levels could be set, as shown in the table of FIG. 3. For a specific target VT level, programming would be initiated using a given combination of programming assist voltages on the SL and BL. As mentioned above, decrements with each repeat programming process can be set depending on the desired resolution. For example, for 2-bit storing, relatively high decrement values could be used (e.g., approximately 0.04V, 0.05V or more). For 3-bit or greater storing, lower decrement values could be used (e.g., approximately 0.03V, 0.025V, or less). Again, there will be a tradeoff between resolution and speed. Furthermore, after some number of repeat programming processes and, thereby a certain number of decrements, the next decrement would equal to the starting voltage of the next stage so we can change to that one. For example, 264.0 starts at VDD/4; 264.1 starts at VDD/5 and 264.2 starts at VDD/10. Decrements could be defined such that after the same amount of pulses 264.0 reaches the value closest to the starting voltage of 264.1 while 264.1 reaches the closest voltage to 264.2. In the next cycle we would switch the 213/211 voltages to the next lower stage (264.0 to 264.1) and start from highest stage voltage again.

In this case, the row control block 292 can be configured so that the programming processes (including the initial programming process and any repeat programming processes) are all performed using a fixed-level wordline voltage pulse (i.e., using the same wordline voltage pulse). Alternatively, the row control block 292 can be configured so that the programming processes (including the initial programming process and any repeat programming processes) are performed using incremental wordline voltage pulses (e.g., using wordline voltage pulses that are increased with subsequent programming process). In some embodiments, the row control block 292 can be configured so that the programming processes (including the initial programming process and any repeat programming processes) are performed using a fixed-level wordline voltage pulse with all possible decremental programming assist voltages and that starting again with a higher wordline voltage pulse.

In any case, the programming processes (including the initial programming process and the repeat programming processes, if necessary) can be performed until the data verification signal has the first value (i.e., until programming is verified) or until some other condition is met.

The memory structure embodiments 200A-200C are optimally employed for multi-bit data storage, as described above. However, it should be understood that the description is not intended to be limiting. Alternatively, the memory structure embodiments 200A-200C could be employed for single-bit data storage.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/ or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory structure comprising:
    a comparator configured to receive a data output signal and a data input signal,
        wherein the data input signal represents a data value to be stored in a bitcell and the data output signal represents a currently stored data value in the bitcell, and
        wherein the comparator is further configured to perform a comparison of the data output signal and the data input signal and to output a data verification signal based on the comparison; and
    a voltage driver configured to receive the data verification signal and to apply one specific voltage of two different voltages to at least one of a source-line and a bit-line connected to the bitcell depending upon the data verification signal,
    wherein the memory structure further includes:
        columns of memory cells with all memory cells in each column connected between a pair of bit and source lines for the column; and
        column-specific circuitry for the columns, respectively, wherein each instance of the column-specific circuitry includes a corresponding comparator and corresponding voltage driver, and wherein the two different voltages comprise a programming inhibit voltage and a variable programming assist voltage that is lower than the programming inhibit voltage.

2. The memory structure of claim 1,
    wherein the memory structure further comprises a sense circuit connected to the bit-line and configured to sense a parameter on the bit-line and to output the data output signal based on the parameter,
    wherein the specific voltage output by the voltage driver comprises the programming inhibit voltage when the data verification signal has a first value indicating that the currently stored data value in the bitcell and represented by the data output signal is equivalent to the data value to be stored in the bitcell and represented by the data input signal, and
    wherein the specific voltage output by the voltage driver comprises a programming assist voltage that is lower than the programming inhibit voltage when the data verification signal has a second value.

3. The memory structure of claim 2,
    wherein the bitcell comprises a ferroelectric field effect transistor,
    wherein the ferroelectric field effect transistor comprises a source connected to the source-line, a drain connected to the bit-line, and a gate connected to a wordline, and
    wherein the ferroelectric field effect transistor is programmable so as to have a first threshold voltage that represents storage of 1 and erasable so as to have a second threshold voltage that is greater than the first threshold voltage and that represents storage of 0.

4. The memory structure of claim 3,
    wherein the source-line is connected to ground, and
    wherein the voltage driver is configured to output an initial programming assist voltage to the bit-line during an initial programming process following an initial verification process when the data verification signal has the second value and to output decremental programming assist voltages to the bit-line during repeat programming processes following subsequent verification process when the data verification signal has the second value.

5. The memory structure of claim 4, wherein, during the initial programming process and further during each repeat programming process, a fixed-level positive wordline voltage pulse is applied to the wordline.

6. The memory structure of claim 3, wherein the voltage driver is configured to output an initial programming assist voltage to the source-line and to the bit-line during an initial programming process following an initial verification process when the data verification signal has the second value and to output decremental programming assist voltages to the source-line and to the bit-line during repeat programming processes following subsequent verification process when the data verification signal has the second value.

7. The memory structure of claim 6, wherein, during the initial programming process and during each repeat programming process, a fixed-level positive wordline voltage pulse is applied to the wordline.

8. The memory structure of claim 3, further comprising an additional voltage driver configured to receive the data verification signal and to apply an additional specific voltage to the source-line depending upon the data verification signal,
    wherein the voltage driver is configured to output an initial programming assist voltage to the bit-line during an initial programming process following an initial verification process when the data verification signal has the second value and to output decremental programming assist voltages to the bit-line during repeat programming processes following subsequent verification process when the data verification signal has the second value, and wherein the additional voltage driver is configured to output an additional initial programming assist voltage to the source-line during the initial programming process following the initial verification process when the data verification signal has the second value and to output additional decremental programming assist voltages to the source-line during the repeat programming processes following subsequent verification process when the data verification signal has the second value.

9. The memory structure of claim 8, wherein, during at least one repeat programming process, the decremental programming assist voltages output to the bit-line by the voltage driver and to the source-line by the additional voltage driver are different.

10. The memory structure of claim 8, wherein, during the initial programming process and during each repeat programming process, a fixed-level positive wordline voltage pulse is applied to the wordline.

11. A memory structure comprising:
a comparator configured to receive a data output signal and a data input signal,
wherein the data input signal represents a multi-bit data value to be stored in a bitcell and the data output signal represents a currently stored multi-bit data value in the bitcell, and
wherein the comparator is further configured to perform a comparison of the data output signal and the data input signal and to output a data verification signal based on the comparison; and
a voltage driver configured to receive the data input signal and the data verification signal and to apply one specific voltage of multiple different voltages to at least one of a source-line and a bit-line connected to the bitcell depending upon the data verification signal and the data input signal,
wherein the memory structure further includes:
columns of memory cells with all memory cells in each column connected between a pair of bit and source lines for the column; and
column-specific circuitry for the columns, respectively, wherein each instance of the column-specific circuitry includes a corresponding comparator and corresponding voltage driver, and
wherein the multiple different voltages comprise: a programming inhibit voltage; and at least two different programming assist voltages that are lower than the programming inhibit voltage.

12. The memory structure of claim 11,
wherein the memory structure further comprises: a sense circuit connected to the bit-line and configured to sense a parameter on the bit-line and to output the data output signal based on the parameter,
wherein the specific voltage comprises the programming inhibit voltage when the data verification signal has a first value indicating that the currently stored multi-bit data value in the bitcell and represented by the data output signal is equivalent to the multi-bit data value to be stored in the bitcell and represented by the data input signal, wherein the specific voltage comprises a specific programming assist voltage of the different programming assist voltages when the data verification signal has a second value, and
wherein the specific programming assist voltage is associated with a specific multi-bit data value represented by the data input signal.

13. The memory structure of claim 12,
wherein the bitcell comprises a ferroelectric field effect transistor,
wherein the ferroelectric field effect transistor comprises a source connected to the source-line, a drain connected to the bit-line and a gate connected to a wordline, and
wherein the ferroelectric field effect transistor is programmable so as to have multiple different low threshold voltages that represent storage of multiple different multi-bit data values, respectively, and is erasable so as to have a high threshold voltage that is greater than the multiple different low threshold voltages and that represents storage of an all 0's multi-bit data value.

14. The memory structure of claim 13, wherein the source-line is connected to ground, and wherein the voltage driver is connected to the bit-line.

15. The memory structure of claim 13, wherein the voltage driver is connected to the source-line and to the bit-line.

16. The memory structure of claim 13,
wherein the voltage driver is connected to the bit-line,
wherein the memory structure further comprises an additional voltage driver connected to the source-line, and
wherein the additional voltage driver is configured to receive the data input signal and the data verification signal and to apply an additional specific voltage to the source-line depending upon the data verification signal and the data input signal.

17. The memory structure of claim 16, wherein, during an initial programming process, a specific combination of programming assist voltages applied to the bit-line by the voltage driver and to the source-line by the additional voltage driver achieve a specific threshold voltage of the multiple different low threshold voltages.

18. A memory structure comprising:
a comparator configured to receive a data output signal and a data input signal,
wherein the data input signal represents a multi-bit data value to be stored in a bitcell and the data output signal represents a currently stored multi-bit data value in the bitcell, and
wherein the comparator is further configured to perform a comparison of a data output signal and a data input signal and to output a data verification signal based on the comparison; and
a voltage driver configured to receive the data input signal and the data verification signal and to apply one specific voltage of multiple different voltages to at least one of a source-line and a bit-line depending upon the data verification signal and the data input signal,
wherein the multiple different voltages comprise: a programming inhibit voltage; and at least two variable programming assist voltages that are lower than the programming inhibit voltage.

* * * * *